United States Patent [19]
Hunt

[11] Patent Number: 5,581,229
[45] Date of Patent: Dec. 3, 1996

[54] COMMUNICATION SYSTEM FOR A POWER DISTRIBUTION LINE

[75] Inventor: Paul C. Hunt, Brainerd, Minn.

[73] Assignee: Hunt Technologies, Inc., Brainerd, Minn.

[21] Appl. No.: 93,762

[22] Filed: Jul. 19, 1993

Related U.S. Application Data

[63] Continuation-in-part of Ser. No. 631,390, Dec. 19, 1990, abandoned, and Ser. No. 879,204, May 6, 1992, abandoned.

[51] Int. Cl.$^6$ .............................................. H04M 11/04
[52] U.S. Cl. ........................... 340/310.02; 340/310.01; 340/642; 340/953
[58] Field of Search .................................. 340/642, 947, 340/953, 931, 310 R, 310 A, 870.03, 870.09, 870.16, 870.18, 310.2, 310.3, 310.1; 315/130, 132; 455/45; 375/45; 324/66

[56] References Cited

U.S. PATENT DOCUMENTS

| | | | |
|---|---|---|---|
| H678 | 9/1989 | Baker et al. ...................... | 340/310.02 |
| 3,196,350 | 7/1965 | Dimon .................................. | 325/26 |
| 3,274,489 | 9/1966 | Behr .................................... | 324/529 |
| 3,656,112 | 4/1972 | Paull . | |
| 3,659,280 | 4/1972 | Donohoo . | |
| 3,715,741 | 2/1973 | McWade et al. .................... | 340/953 |
| 3,778,718 | 12/1973 | Bass et al. .......................... | 325/139 |
| 3,815,119 | 6/1974 | Finlay, Jr. et al. ................. | 340/310 R |
| 3,829,765 | 8/1974 | Siler .................................... | 324/67 |
| 3,873,849 | 3/1975 | Babcock et al. .................... | 307/115 |
| 3,904,954 | 9/1975 | Knudson ............................. | 323/48 |
| 3,911,415 | 10/1975 | Whyte ................................. | 325/48 |
| 3,919,640 | 11/1975 | Simciak .............................. | 325/30 |
| 3,922,664 | 11/1975 | Wadsworth ....................... | 340/825.52 |
| 3,944,932 | 3/1976 | Fong ................................... | 455/307 |
| 3,980,954 | 9/1976 | Whyte ................................. | 325/48 |
| 3,991,363 | 11/1976 | Lathrop .............................. | 324/529 |
| 3,996,797 | 12/1976 | Torimaru et al. .................. | 73/861.16 |
| 4,090,138 | 5/1978 | Voorman et al. .................. | 325/163 |
| 4,091,361 | 5/1978 | Eichelberger et al. ............ | 340/310.03 |
| 4,117,405 | 9/1978 | Martinez ............................ | 325/58 |
| 4,177,405 | 12/1979 | Chapdelaine ..................... | 315/159 |
| 4,199,761 | 4/1980 | Whyte et al. ....................... | 340/695 |
| 4,208,630 | 6/1980 | Martinez ............................ | 375/7 |
| 4,225,851 | 9/1980 | Reschovsky et al. ............. | 340/870.04 |
| 4,232,298 | 11/1980 | Ley ..................................... | 340/310.03 |
| 4,241,326 | 12/1980 | Odom . | |
| 4,295,079 | 10/1981 | Otsuka et al. ..................... | 315/130 |
| 4,297,632 | 10/1981 | Glaser et al. ...................... | 324/51 |
| 4,323,841 | 4/1982 | Jacobsen ............................ | 324/51 |
| 4,396,868 | 8/1983 | Watanabe et al. ................. | 315/130 |
| 4,415,771 | 11/1983 | Martinez ............................ | 179/5 R |
| 4,442,319 | 4/1984 | Treidl ................................. | 340/310 R |
| 4,449,073 | 5/1984 | Mongoven et al. ............... | 315/130 |

(List continued on next page.)

OTHER PUBLICATIONS

Remote Meter Reading, Load Control and Distribution System Automation Utilizing SWD Technology, Feb. 1994.

*Primary Examiner*—Brent A. Swarthout
*Attorney, Agent, or Firm*—Westman, Champlin & Kelly, P.A.

[57] ABSTRACT

The invention provides a layered modulation data communication systems characterized by numerous, asynchronous data transmitters operating on a power line. Data is modulated onto relatively low frequency subcarriers. Subcarriers are used to modulate carriers centered on a common frequency. The subcarriers are frequency division multiplexed. Data is recovered by demodulating the subcarriers from the carriers and subsequently demodulating the data from the subcarriers.

21 Claims, 6 Drawing Sheets

U.S. PATENT DOCUMENTS

| | | | |
|---|---|---|---|
| 4,538,136 | 8/1985 | Drabing | 340/310.03 |
| 4,668,935 | 5/1987 | McDermott | 340/332 |
| 4,675,574 | 6/1987 | Delflache | 315/130 |
| 4,701,945 | 10/1987 | Pedigo | 340/310 A |
| 4,772,806 | 9/1988 | Lean et al. | 307/38 |
| 4,800,363 | 1/1989 | Braun et al. | 340/310.02 |
| 4,801,868 | 1/1989 | Brooks | 324/66 |
| 4,816,738 | 3/1989 | Nicolas | 323/258 |
| 4,835,517 | 5/1989 | van der Gracht et al. | 340/310 A |
| 4,904,950 | 2/1990 | Brown et al. | 340/642 |
| 4,912,372 | 3/1990 | Mongoven et al. | 315/122 |
| 4,939,505 | 7/1990 | Cappellini et al. | 340/642 |
| 4,952,905 | 8/1990 | Oliver | 340/310 A |
| 4,998,059 | 3/1991 | Nigon et al. | 324/67 |
| 5,095,502 | 3/1992 | Finzel | 340/310 A |
| 5,241,687 | 8/1993 | Short | 455/45 |
| 5,243,340 | 9/1993 | Norman et al. | 340/947 |
| 5,252,967 | 10/1993 | Brennan et al. | 340/310 A |
| 5,263,185 | 11/1993 | Bush | 455/226.3 |

COMMUNICATION SYSTEM FOR A POWER DISTRIBUTION LINE

CROSS REFERENCE TO RELATED APPLICATION

This application is a continuation-in-part of applications Ser. No. 07/631,390, filed Dec. 19, 1990 and Ser. No. 07/879,204, filed May 6, 1992, now abandoned.

FIELD OF THE INVENTION

The invention relates to asynchronous, low baud data transmission from a plurality of sources distributed over a single channel to a receiver.

BACKGROUND OF THE INVENTION

Airfield runway lighting exemplifies an application of the communications system of this patent. Airfield lighting systems use lamps positioned along runways, taxiways and runway thresholds to aid airmen in aircraft operation to, from, and on an airfield, particularly at night or in adverse weather conditions. Associated groups of lamps, for example those lining one or both sides of a runway, are typically energized from a single energization line or power loop circuit. The lamps themselves are typically low wattage incandescent bulbs.

Each lamp of a group is located, typically one to a circuit, in a secondary circuit to isolate it from the power loop in case the lamp burns out or is missing. The secondary circuits which contain the lamps are electrically coupled to the power loop by isolating transformers. The primary windings of the isolating transformers are connected in series between the input and output of the power loop and the secondary windings are connected directly to the lamps.

The primary power loop is supplied with energy by a regulated AC current source, which provides an alternating current with a constant root mean square current amplitude. Upon failure of a lamp, the secondary circuit associated with an isolating transformer will be in an open circuit condition, with a consequent effect upon the load it imposes on power loop during its operation. Such changes in load have subsequent measurable effects on the power signal.

A number of prior art systems exploited such phenomenon to generate indication of the existence and number of lamp failures in a group. However, such systems generally could not identify particular failed lamps. Identification of the location of a failed lamp still required personal inspection of all lamps in a circuit to locate a failed lamp. Such personal inspection can prove a complicated job on large airfield, and a tedious, time consuming procedure at any airfield.

However, the information collected by such inspection, once existence of a failure is determined, is quantitatively small, i.e. the locations of the failed lamps. A more complete data set for the lamps of a group would include the on/off status of each lamp by location, which is still, quantitatively, a small amount of information. Notwithstanding the minimal amount of information to be collected, the low density of the data sources compared to the length of cable required to collect the information has made it uneconomic to use conventional data transmission systems for collection of the information.

The problem of collecting the information from airfield lighting systems is qualitatively similar to collecting electrical power meter readings from residences and other commercial power users. Here the problem again includes widely distributed, but numerous data sources, each generating data at an extremely low rate. Notwithstanding a direct physical connection to electrical power meters, utilities still commonly employ personal inspection of meters to determine power usage.

SUMMARY OF THE INVENTION

The invention provides a plurality of data transmitters operating asynchronously on a single channel and at least a first receiver for decoding the data from the transmitters. As used here, the term channel refers to a single path for the transmission of electrical signals, in distinction to other parallel paths.

Each data transmitter provides at least two stages of modulation. More particularly, a data generating element generates a baseband information signal for modulation of an ultra low frequency oscillator. The resulting first modulated subcarrier signal modulates a second higher frequency oscillator. The output of the second oscillator may be inserted into a transmission path, or used as a modulating signal for yet another, still higher frequency oscillator. As many stages of progressively higher frequency modulation may be provided as desired. This is called layered modulation.

Final output stage oscillators are tuned to approximately the same output carrier frequency. Data modulation stage oscillators (i.e. non. output stage oscillators) are frequency differentiated permitting identification of the source of a particular data transmission. In a preferred embodiment, the frequency of the output stage oscillators of the plurality of data transmitters are referenced to a common reference signal such as the frequency of the AC power distribution line to prevent harmful interference caused by beat frequencies between multiple transmitters.

As an option, the output stage oscillator of each transmitter is subjected to small random or pseudorandom phase or frequency variation. Thus, while final carrier signals for a plurality of data sources are intended to be centered on nearly the same frequency, interfering beat frequencies, which would normally be generated by small frequency differences in their respective signal carriers were the oscillators highly stable, are diffused over a wide band resulting in substantially negligible interference between transmitters.

At least a first receiver is provided for recovery of the signals on the channel. The receiver demodulates signal carriers in a frequency band centered on the frequency of interest in order to separate the layered modulation transmitted from the data transmitters. The output of a first demodulating stage having a frequency of interest equal to the output stage oscillators of the data transmitters, includes a subcarrier from each transmitter operating on the channel and noise. The number of layers of demodulatation will equal the number of layers of modulation used in the transmitters. At some level of demodulation the frequency differentiated subcarriers are recovered, and subjected to analysis (demodulation) consistent with the modulation technique used for recovery of the transmitted data. Multiple information streams may be recovered simultaneously.

DETAILED DESCRIPTION OF THE PREFERRED EMBODIMENT

Figure 1:
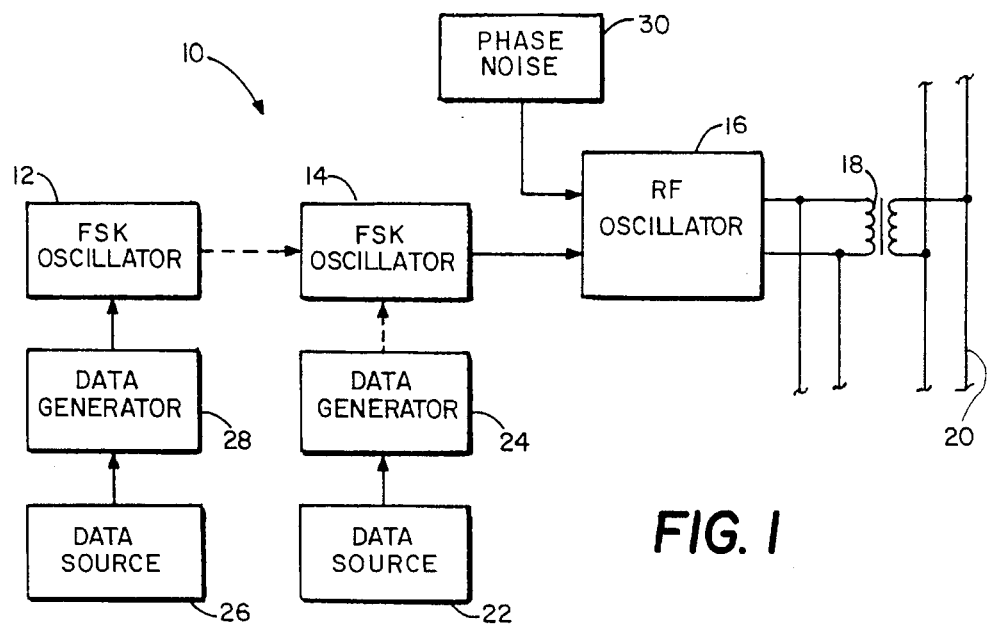
FIG. 1 is a block diagram illustrating a data transmission element.

FIG. 1 is a block diagram of a preferred embodiment of a data encoder and transmitter 10 used in the communication system of the present invention. Data encoder 10 includes an optional first stage frequency shift keying oscillator 12, a second stage frequency shift keying oscillator 14, and a frequency shift keying radio frequency (RF) output oscillator 16 connected in series. Output oscillator 16, illustrated as an RF oscillator to clarify its function as a final carrier frequency generator and has the highest operating frequency, is coupled by an isolating transformer 18 to a two wire power line 20, which provides a transmission medium. Second stage oscillator 14 takes as a modulating signal either the subcarrier generated by oscillator 12 or a baseband data signal generated by data source 22, e.g. a condition sensor, and a data signal generator 24.

Where a data stream representing a meter reading is to be used as a modulation source, data source 26 can pass the information to a data signal generator 28 for generating a modulating signal for first stage oscillator 12. The subcarrier signal generated will be provided to second stage modulator 14 for generation of a subcarrier signal having higher mark and space frequencies. The second stage carrier in turn provides a modulating input to RF output oscillator 16 for generation of a still higher frequency output carrier signal. Otherwise, the data source 22 is the meter providing meter readings to the data signal generator 24 for generating a modulating signal for oscillator 14, which in turn generates a subcarrier modulating signal for the RF output oscillator 16. As described above, at a minimum two stages of modulation are provided.

A plurality of output carrier signals may simultaneously be applied to power line 20 from other like data encoders 10. The output carrier signals of the various encoders 10 have approximately the same center frequencies, i.e. a group of encoders 10 will operate on a single channel, defined by power line 20 and a predetermined bandwidth centered on the desired frequency of the output carriers of encoders 10.

To prevent harmful interference caused by beat frequencies between multiple transmitters, the RF oscillators 16 which are used to generate the carrier signals are constructed to have a low stability factor. For a 400 KHz RF output oscillator, stability of about plus or minus 30 Hz is acceptable. In addition, each RF output oscillator 16 may independently be subjected to random or pseudorandom phase discontinuities. The output carrier signals from a potentially large plurality of oscillators may be simultaneously transmitted onto power line 20.

Frequency Shift Keying ("FSK") is a well known form of frequency modulation in which the modulating signal shifts the output frequency between predetermined values. In the preferred embodiment a baseband data signal modulates, through frequency shift keying, a subcarrier signal by shifting the signal between two discrete values. These values are termed the mark and the space frequencies. Each data stage FSK oscillator, e.g. FSK oscillator 14 for a two layer modulation scheme, has a distinct frequency pair assigned to it. The subcarrier signal generated thereby provides a modulating wave to at least a second stage of frequency shift key modulation to generate an output carrier for transmission. The output carrier is subjected to random phase discontinuities before transmission.

Figure 2:
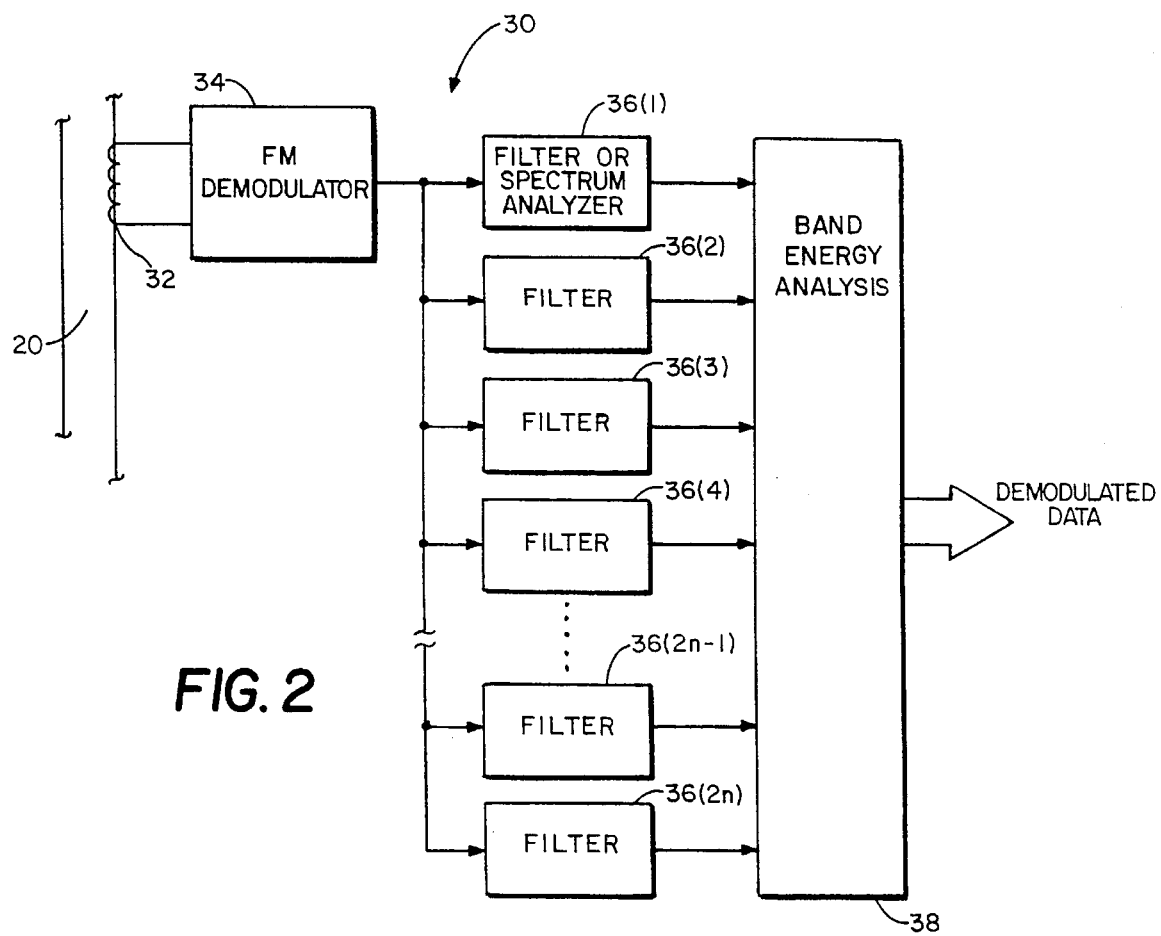
FIG. 2 is a block diagram illustrating a receiver and decoder element.

FIG. 2 shows a common receiver 30 coupled by a toroidal coil 32 to power line 20. The receiver 30 is a frequency shift keying receiver and includes a frequency modulation demodulator 34 that recovers the first layer subcarrier signals from the detected carrier signals. Parallel filtering of the subcarrier signals is performed by narrow band bandpass filters or spectrum analyzers 36(1) through 36(2n). Pass band filtering performs the second level of demodulation and recovers the subcarriers originating from n subcarrier transmitters, typically, but not exclusively, associated with n data encoders 10. One filter 36 is tuned to the center frequency of one mark or space frequency, and generates a time varying signal representing instantaneous power in a narrow bandwidth around the respective mark or space frequency.

A band energy analysis element 38 takes the bandwidth power signals out of filters 36 as inputs, compares relative power levels of associated mark and space frequency pairs, and generates an output reflecting the original intelligence signals based on the relative power levels of the associated mark and space frequency pairs. This process is described in more detail with reference to FIG. 5.

Although described with reference to the well known modulation technique called frequency shift keying, it is to be understood that many other types of modulation techniques commonly known in the art are equally applicable in the present invention. For instance, continuous modulation techniques such as amplitude modulation, frequency modulation or phase modulation could be used. In addition, pulse code modulation techniques such as pulse amplitude modulation, pulse duration modulation and pulse position modulation could also be used. When the transmitted information consists only of two binary states, on-off, such as where the information transmitted is the on or off status of a particular lamp, the "keying" modulation techniques such as frequency shift keying are particularly well suited. Other keying modulation techniques include amplitude shift keying and phase shift keying. If desired, the data stage oscillators and the final stage oscillators can employ different modulation techniques. Common modulation techniques used in the art are discussed in chapter 14 of *Electronic's Engineers' Handbook*, edited by Donald G. Fink et al. and published by McGraw-Hill Inc., 1982, and which is hereby incorporated by reference. *Modern Electronic Circuits Reference Manual*, by John Markus, published by McGraw-Hill Inc., 1980, provides suitable modulator and demodulator circuits used in the art and applicable to the modulation techniques described above and is hereby incorporated by reference.

Referring back to FIG. 1, the frequency shift keying oscillator 14 could be replaced by a suitable frequency modulator transmitting a signal having a single frequency which is unique to each transmitter 10 location. In this embodiment, the frequency would transmit a signal for example when a given lamp is on and not transmit any signal when the lamp is off. Correspondingly, only N filters 36 of FIG. 2 would then be required (one for each transmitter location) in order to determine the state of the lighting system. By comparing the signal from each of the filters 36 to a reference or threshold level to eliminate incorrect interpretations due to noise on the channel, the status of each lamp is thus determined.

Figure 7:
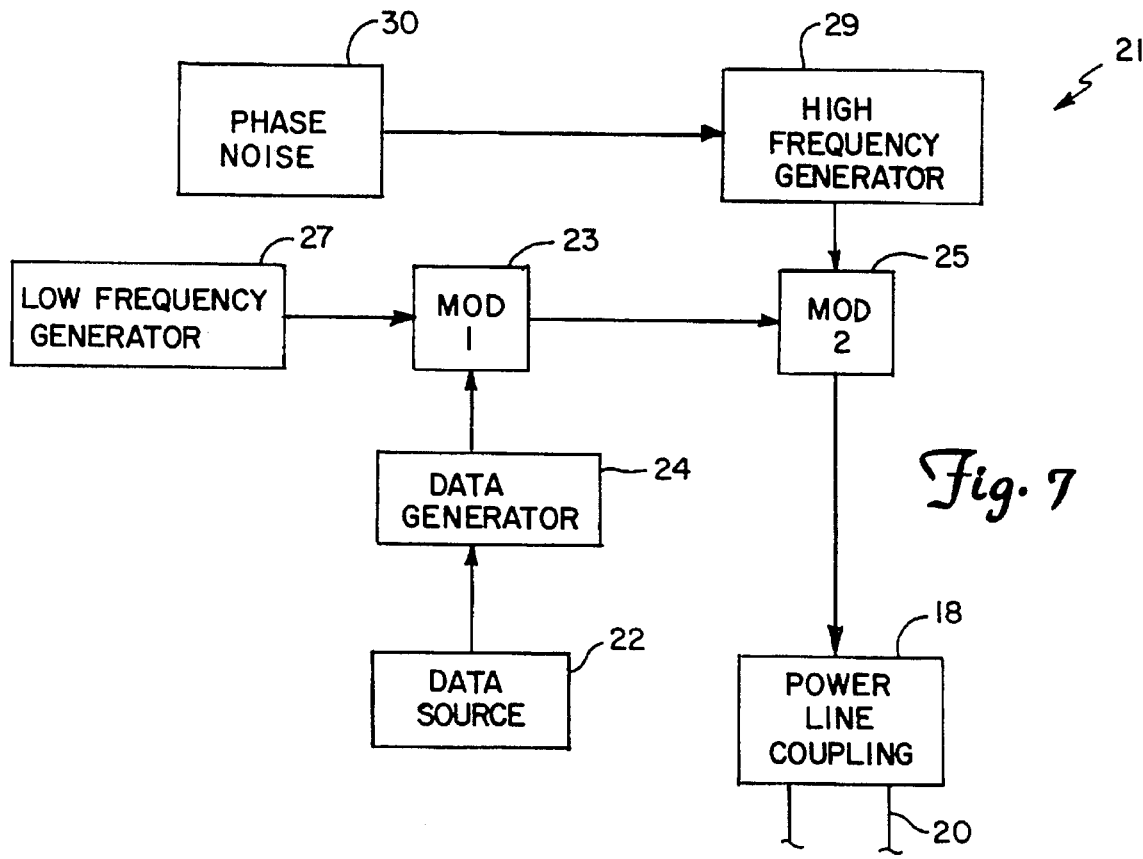
FIG. 7 is a block diagram of a generic data transmission element of the present invention utilizing two levels of modulation.

FIG. 7 is a block diagram of a more generalized transmitter 21 of the present invention. Transmitter 21 comprises two levels of modulation provided by modulators 23 and 25, respectively. The modulator 23 receives as a modulating input a data signal containing the information to be transmitted from the data signal generator 24 to modulate the signal from a low frequency signal generator 27. As described above, the data signal generator 24 is connected to data source 22 which may be a condition sensor such as a lamp sensor, or possibly a meter such as a power meter.

The output signal from modulator 23 is provided to the second stage modulator 25. The second stage modulator 25 receives a signal from a high frequency generator 29 having a higher frequency than that of low frequency generator 27. As described below, preferably, the low frequency generator 27 provides a signal having a frequency between 1–15 Hz for the first stage of modulation, while the high frequency generator 29 provides a signal to the second stage of modulation having a frequency that is 4–10 times higher than the low frequency generator 27. At a minimum, the frequency of the high frequency generator 29 is at least twice the frequency of that of the low frequency generator 27. The higher frequency could be significantly higher for example greater than a 100 KHz; however, transmission on a power distribution line at these frequencies could cause interference for other devices connected or located near the line. Therefore, a high frequency of less than 10 KHz is preferred. It is also important to note that the signal from modulator 23 has an ultra narrow bandwidth (less than one hertz). In addition, the output signal from modulator 23 has a carrier frequency that is unique to each transmitter location in order to distinguish it from other transmitters at other locations, while the output signal from the modulator 25 has a carrier frequency common to all transmitters. In other words, at a minimum one unique selected frequency is used for each transmitter location. The modulators 23 and 25 can be utilizing the same modulation techniques, or alternatively may be utilizing differing modulation techniques. If a modulation technique such as frequency shift keying is utilized, as described above, an additional frequency is also used by the respective modulator. However, the additional frequency is not necessary in order to distinguish the transmitter's location, but rather, is required by the nature of the modulation technique.

Figure 8:
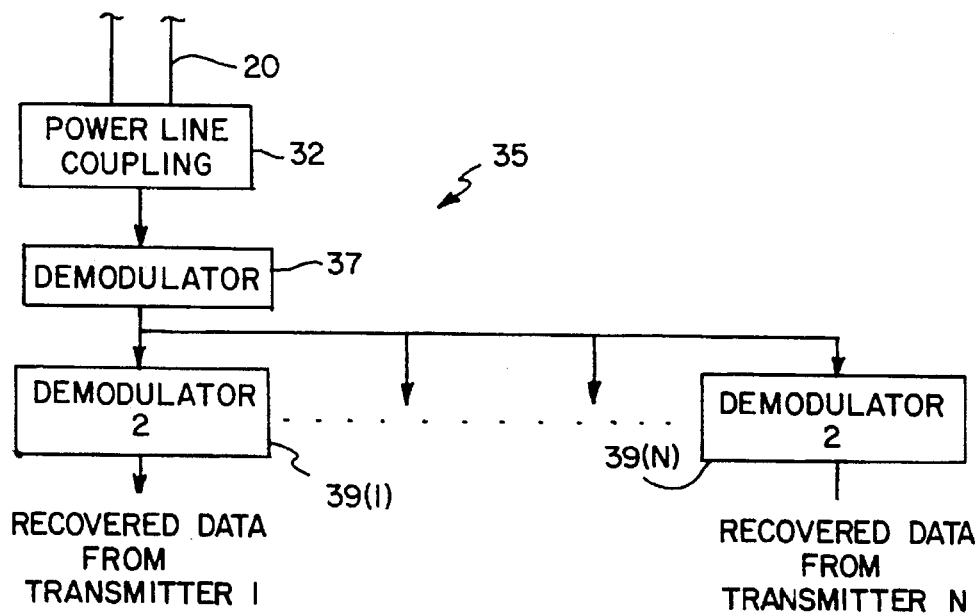
FIG. 8 is a block diagram of a generic receiver of the present invention utilizing two levels of demodulation.

FIG. 8 is a block diagram of a more generalized receiver 35 of the present invention. The receiver 35 receives signals from the transmitters of the type illustrated in FIG. 7 from the power line 20 and has multiple levels of demodulation consistent with and of the type necessary to operate with each transmitter 21. As illustrated, the receiver 35 includes two levels of demodulation with a first demodulator 37 having a frequency of interest consistent with the modulator 25 and being the common output carrier frequency of all of the transmitters. An output signal from the demodulator 37 is provided to a set of N second level demodulators 39, wherein each demodulator 39(1) to 39(N) has at least one unique frequency of interest consistent with the data signal modulators 23 of each transmitter 21. The output signal from each demodulator 39(1) to 39(N) is representative of the information transmitted by each corresponding transmitter.

Figure 9:
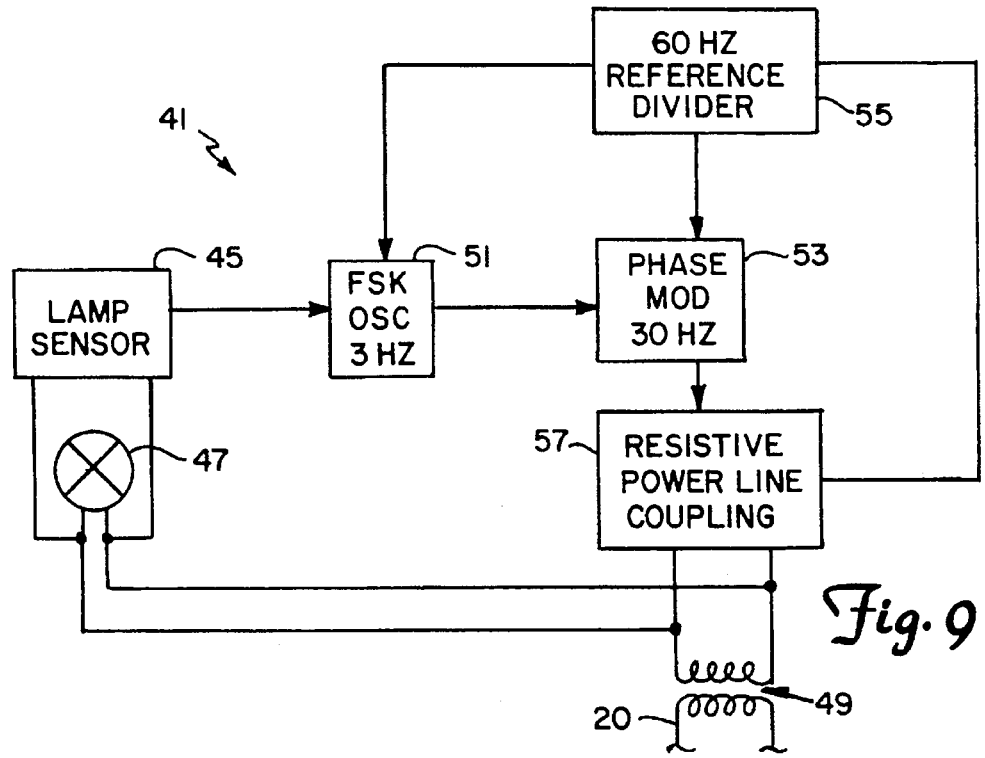
FIG. 9 is a block diagram of a second preferred embodiment of the present invention as applied to airfield runway light monitoring.

FIG. 9 is a block diagram of a transmitter 41 used in a second preferred embodiment of the present invention. The transmitter 41 transmits the status of a lamp 47 detected by a lamp sensor 45. The lamp sensor 45 can be a photo sensitive or heat sensitive device placed close to the lamp 47. In the preferred embodiment, the lamp sensor 45 monitors the voltage at the lamp terminals. Commonly, the lamp 47 is coupled to an alternating current (AC) power source through a transformer 49 and when lit, a sinusoidal voltage is present across the lamp terminals. If the lamp 47 was then to burn out, detectable voltage spikes are present on the waveform across the lamp terminals due to saturation of the transformer 49 core. In this embodiment, the lamp sensor 45 monitors the waveform across the lamp terminals providing an output signal to a frequency shift keying oscillator 51 corresponding to the presence or absence of the voltage spikes.

The frequency shift keying oscillator 51 provides a first level of modulation and has at least one unique frequency in order to distinguish the transmitter 41 from other like transmitters operating on the system. An output signal from the frequency shift keying oscillator 51 having a center frequency of, for example, 3 Hz is provided to a phase modulator 53 which modulates a common carrier frequency of, for example, 30 Hz used by all transmitters operating on the system for transmission on the power line 20 through a resistive power line coupling 57. The transmitter 41 thus exemplifies use of layered modulation using two different modulation techniques. Referring back to the generalized receiver of FIG. 8, demodulator 37 would then be a phase demodulator with a frequency consistent with that of phase modulator 53, while one of the demodulators 39(1) to 39(N) would be a frequency shift keying demodulator to detect the presence of either the transmitted mark or space frequencies corresponding to the frequency shift keying oscillator 51 and thus the status of lamp 47.

In this preferred embodiment, the frequency shift keying oscillator 51 and the phase modulator 53 of this transmitter 41 derive their frequencies from a common reference through a reference divider 55. By further using a common reference frequency, such as the 60 Hz power frequency common to each lamp in the lighting circuit, harmful interference caused by beat frequencies between multiple transmitters is prevented. Alternatively, random phase shift discontinuities as described below can be introduced to spread beat frequencies from multiple transmitters over a wider bandwidth thus reducing their interference effect.

Figure 10:
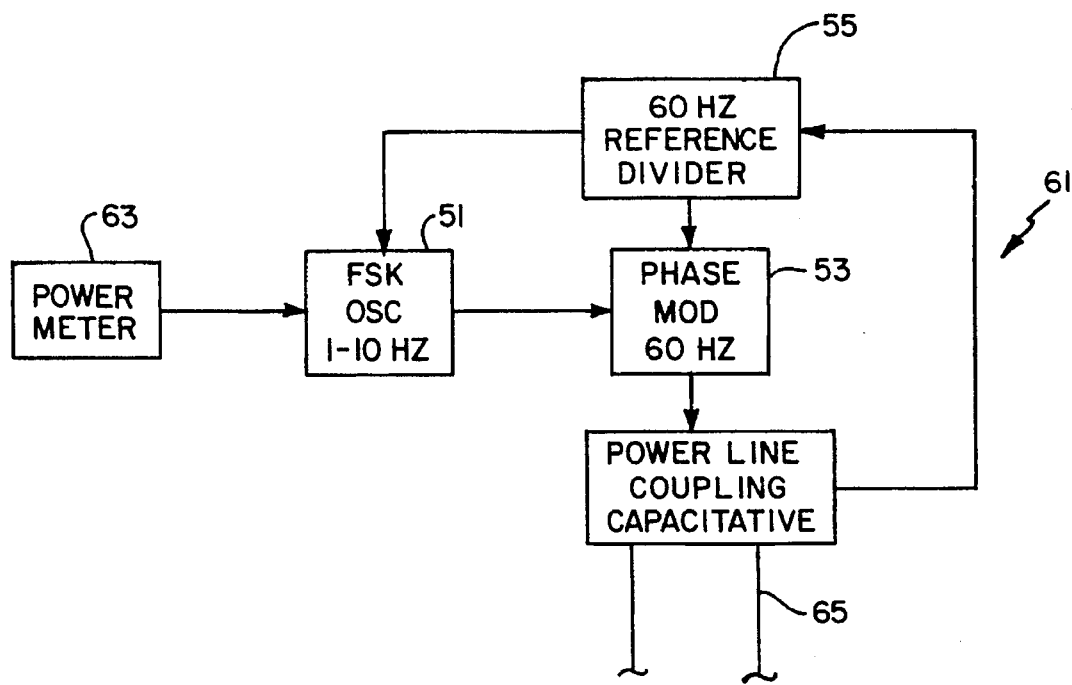
FIG. 10 is a block diagram of a preferred embodiment of the present invention as applied to collecting power meter readings.

FIG. 10 illustrates in block diagram form a transmitter 61 of the present invention suitable for transmitting power meter readings. The transmitter 61 is almost identical to that of transmitter 41 illustrated in FIG. 9 utilizing both the frequency shift keying oscillator 51, the phase modulator 53 and the divider 55. In this embodiment, the frequency shift keying oscillator 51 operates with a center frequency of 1–10 Hz, while the phase modulator 53 operates at a higher frequency of 60 Hz. The frequency shift keying oscillator 51 receives data to be transmitted from a power meter 63 in a suitable form indicating the desired data to be transmitted such as the power consumed in a given time period. The data is transmitted to a remote common receiver on the power line 65 for demodulation and subsequent recovery through a capacitive power line coupling 67.

The remainder of this description provides a detailed discussion of an application of the present invention for use as an airfield runway lighting status detection system. As exemplified, frequency shift keying is utilized as a modulation technique; however, it is to be understood that other modulation techniques are also applicable.

Figure 3:
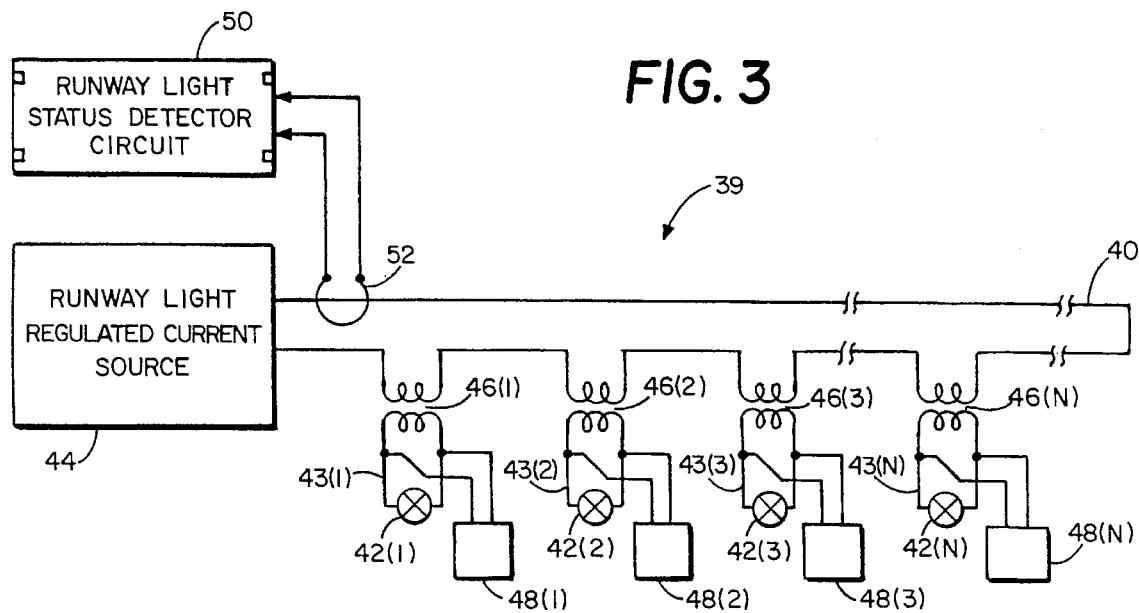
FIG. 3 is a block diagram of the preferred embodiment of the invention as applied to airfield runway light monitoring.

FIG. 3 illustrates application of the present invention on a runway lighting system 39 having a loop power circuit 40 for illuminating lamps 42(1) through 42(N) arranged along an airfield runway (not shown). Loop power circuit 40 is energized from a runway light regulated ac current source 44. Current source 44 provides alternating current at 60 Hz with a constant root-mean-square (rms) amplitude. Lamps 42(1) through 42(N) are located in secondary circuits 43(1) through 43(N), coupled to power loop 40 by a plurality of series connected coupling transformers 46(1) through 46(N), respectively. Also connected to each of secondary circuits 43(1) through 3(N) are status transmitters 48(1) through 48(N), respectively.

A status transmitter 48 detects whether a lamp 42 is on or off, and transmits a signal indicating the status of the lamp across transformer 46 onto loop power circuit 40. The signals from transmitters 48(1) through 48(N) are multiplexed onto loop power circuit 40 and recovered by runway light status detector circuit 50 through a toroidal coil 52 positioned around the wire of loop power circuit 40.

Figure 4:
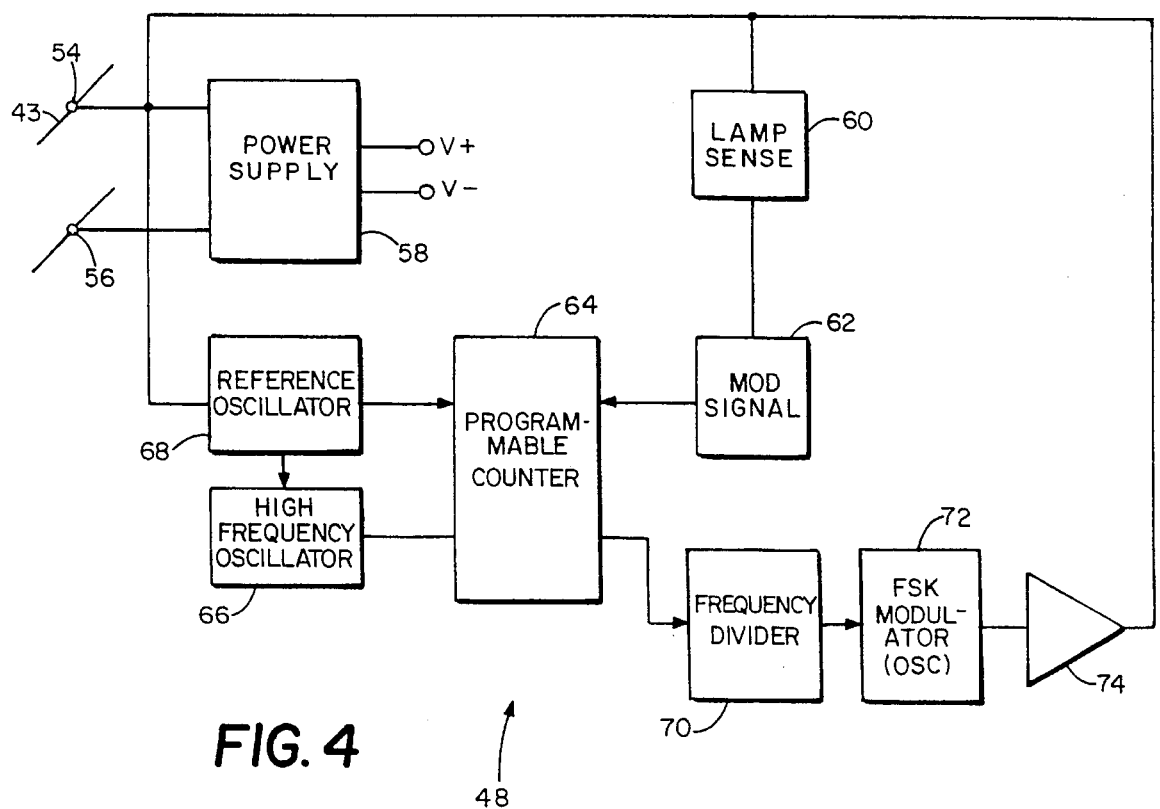
FIG. 4 is a more detailed block diagram of a data transmission element from FIG. 3.

FIG. 4 illustrates a representative status transmitter 48. Status transmitter 48 is connected into a secondary circuit 43 by terminals 54 and 56. A power supply 58 is connected directly across terminals 54 and 56 for deriving power for the circuit components of status transmitter 48 from secondary circuit 43. Lamp sense element is a photosensitive or heat sensitive device responsive to a lamp 42 with which element 60 is in close proximity. Alternatively, the lamp sense element 60 is a voltage monitor described above. Lamp sense element 60 generates a signal indicating either that the associated lamp is lit or that the lamp is not lit. Modulating signal element 62 converts this essentially binary status to a modulating signal which it applies to a programmable down counter 64. The modulating signal changes the down count program of programmable down counter 64 with each change in modulating signal value.

Programmable down counter 64 is clocked by a high frequency oscillator 66. The average clock speed of high frequency oscillator 66 is controlled by a reference oscillator 68 which locks onto the 60 cycle line frequency derived from the power line. Use of the frequency of the power supplied by a power transmission line helps assure that the frequency assignments between the large number of status transmitters coupled to a given power line maintain the same relative distribution and are accurately reproducible by a receiver for use in demodulation.

Programmable down counter 64 generates signals of two frequencies, the mark frequency and the space frequency, depending on the value of the output of modulating signal element 62. The output signal of counter 64 is applied to a frequency divider 70 and the output of the frequency divider is applied as modulation input to a radio frequency oscillator 72. Programmable down counter 64 and frequency divider 70 generate a FSK subcarrier signal of between 1 Hz and 15 Hz, with a 0.0146 Hz spacing between the center frequencies of the mark frequency and the space frequency of the subcarrier signals. The subcarrier is taken as an input modulating signal by an output FSK oscillator 72 which generates a carrier signal with a center frequency of between 100 Hz and 400 Khz. As previously noted, high stability in oscillator 72 is not desirable. High stability in oscillator 72 would result in generation of narrow bandwidth beat notes as a result of slight frequency differences in carrier signals applied from this and other transmitters 48. Narrow bandwidth beat notes interfere with information decoding. The output of oscillator 72 is buffered by an amplifier stage 74 before application to terminal 54.

The carrier of output stage FSK oscillator 72 is optionally subject to random phase shift discontinuities as well. Each data transmission element generates output carriers of approximately the same frequency, thus their own relative instability and exposure to random or pseudo-random phase shifts spreads the bandwidth of potential beat frequencies between output carriers.

Figure 5:
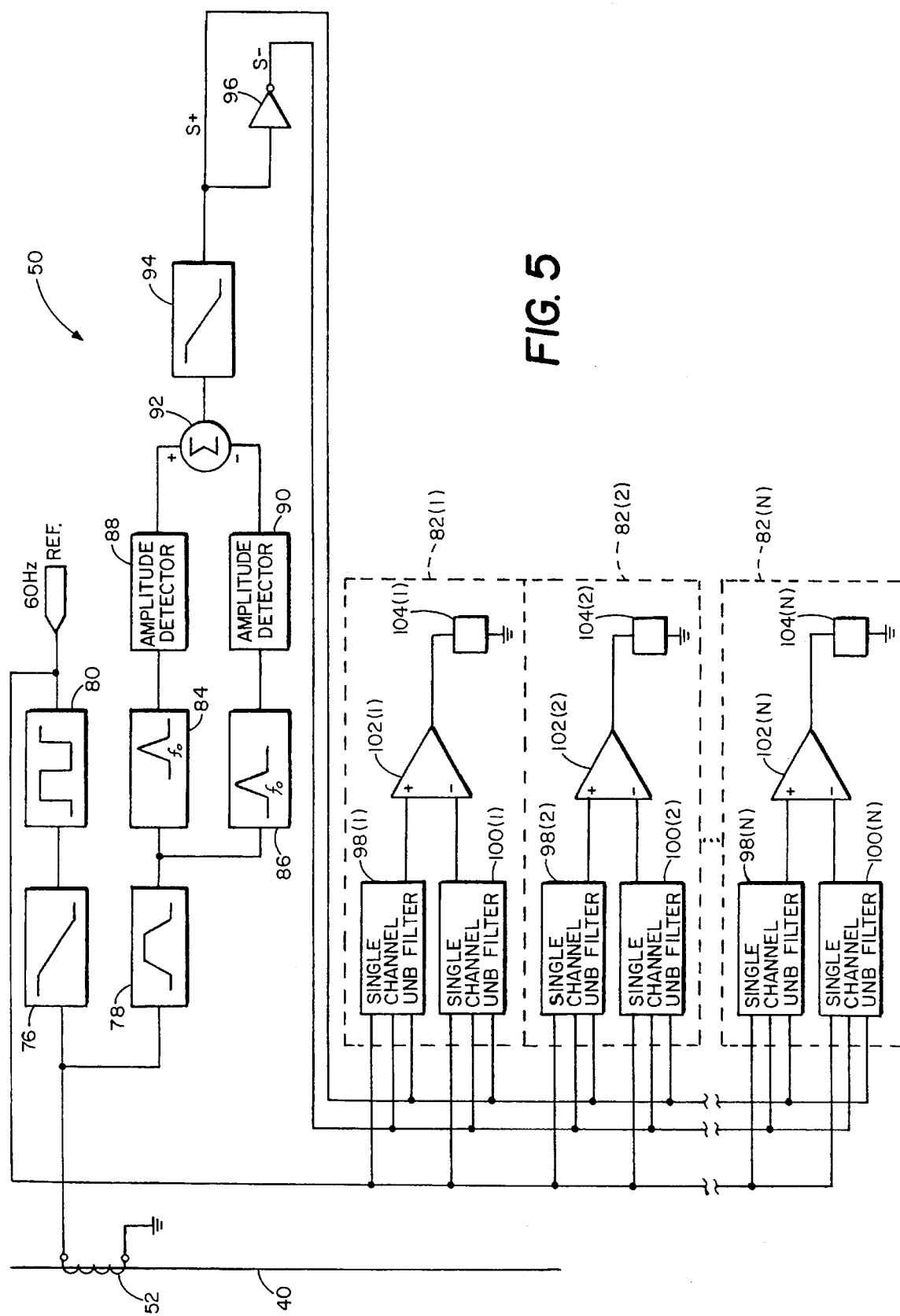
FIG. 5 is a more detailed block diagram of a common signal ultra narrow band receiver.

FIG. 5 illustrates the common receiver 50. Toroidal coil 52 detects oscillating signals on power loop circuit 40 and applies the signals to a low pass filter 76 and a bandpass filter 78. Low pass filter 76 passes a 60 cycle signal to a square wave generator 80 which generates a 60 Hz square wave reference signal (REF). The reference signal is supplied to a plurality of parallel lamp status recovery circuits 82(1) through 82(N).

Bandpass filter 78 is an active bandpass filter tuned to the middle of the output carrier frequency. Bandpass filter 78 passes signal frequencies associated with the output carrier signals from a plurality of transmitters 48(i)–48(n). The output carrier signals are applied to a first stage of demodulation, as illustrated herein is provided by parallel bandpass filters 84 and 86, amplitude detectors 88 and 90, summing element 92, and a low pass filter 94. Bandpass filters 84 and 86 are narrow band filters tuned to the upper and lower ranges, respectively, of the output carrier signals. For example, where the output carrier signals are centered on 10,000 Hz, bandpass filter 84 passes 10,000 Hz to 15,000 Hz and bandpass filter 86 passes 5,000 to 10,000 Hz. In amplitude detectors 88 and 90 the passed signals are boosted and full wave rectified to generate signals indicating the energy in each band. As used herein, the presence of energy in a given band corresponds to transmission of a signal having a frequency generally centered on that band. The signals are summed by subtracting the lower band power level signal from the upper band power level signal at summing element 92, to recover multiplexed subcarrier signals. The multiplexed subcarrier signals (S+), and a certain amount of noise, are the output of low pass filter 94, which provides an additional stage of filtering to remove some noise and higher frequency signals. The multiplexed subcarrier signals and their inverse signals (S+), which are generated by invertor 96, are supplied to lamp status recovery circuits 82(1) through 82(N).

Each of lamp status recovery circuits 82(1)–82(N) is essentially similar, differing from one another only in their frequency response characteristics. These recovery circuits provide the second level of demodulation in order to detect the transmission of the signals wherein at least one unique frequency is associated with each transmitter. A representative lamp status recovery circuit 82(1) includes parallel single channel ultra-narrow band (UNB) digital filters 98(1) and 100(1), which are tuned, respectively, to the mark and the space frequency of the data stage modulator of a particular lamp status transmitter 48(1) consistent with the frequency shift keying used in this embodiment. Single channel UNB digital filters 98(1) and 100(1) output signals proportional to the energy in extremely narrow bandwidths centered on the mark and space frequencies of interest thereby indicating the presence of the corresponding transmitted signal. Alternatively, a plurality of parallel spectrum analyzers could be used to generate an indication of the energy in narrow band widths around each subcarrier frequency used in the system.

Information is recovered in frequency shift keying by comparison of the energy in selected band widths, as previously described with respect to band energy analysis element 38. The output signals of filters 98(1) and 100(1), which are associated frequency pairs as stated above, are compared by a differential amplifier 102(1), which generates a positive signal if the band centered on the mark frequency has greater instantaneous energy, and a negative signal if the band centered on the space frequency has greater instantaneous energy. As is well known in frequency shift keying either the mark or the space frequency is transmitted at a given time, thus the instantaneous energy of one of the frequencies is substantially greater than that of the other. The signal generated by differential amplifier 102(1) is used by a display 104(1) to indicate whether a particular lamp 42(1) is lit or not lit.

Figure 6:
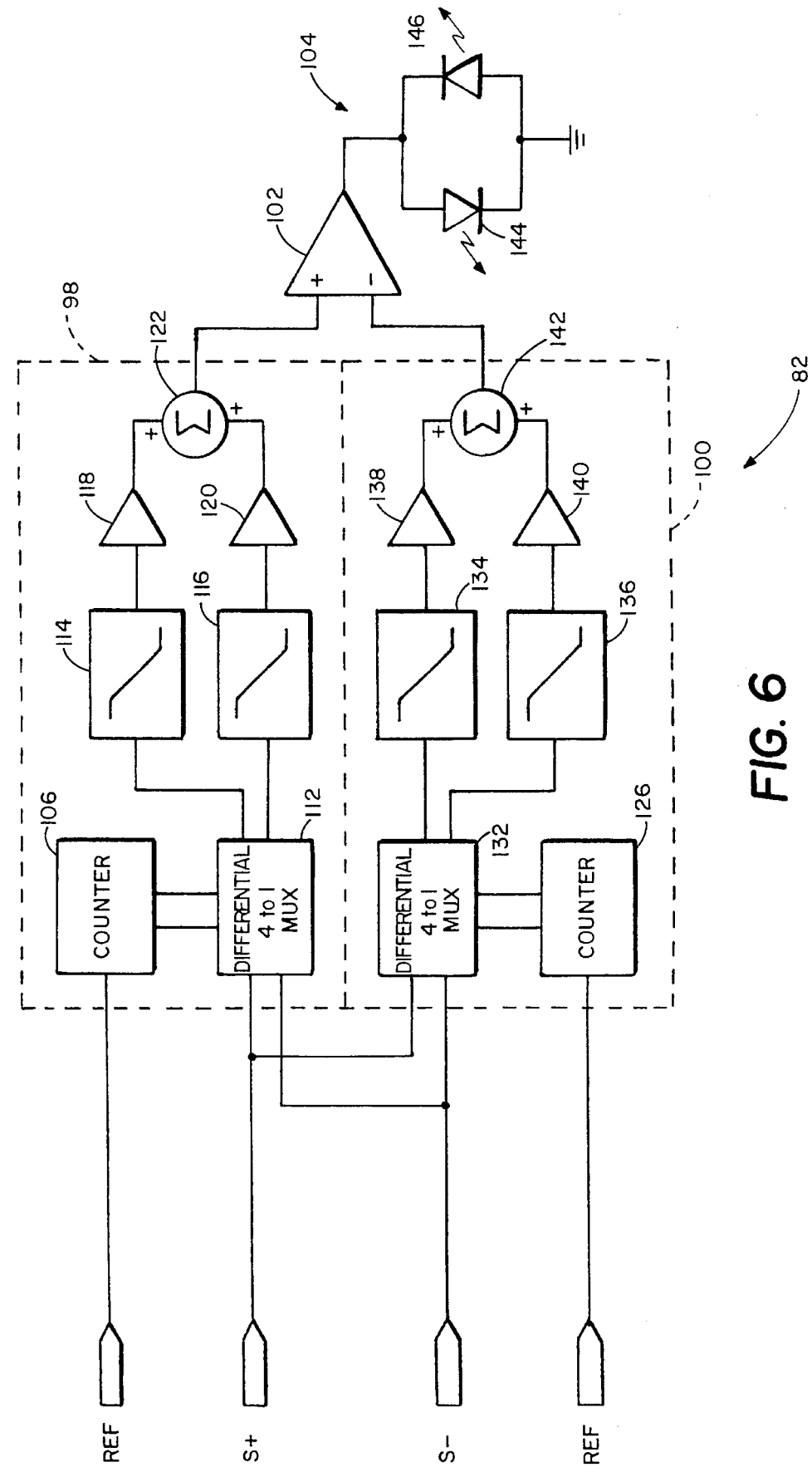
FIG. 6 is a more detailed block diagram of a band energy detection and comparison circuit.

FIG. 6 illustrates a representative lamp status recovery circuit indicated generally by numeral 82. Single channel UNB filter 98 responds to the 60 cycle square wave reference for regenerating a selected mark frequency. The 60 cycle reference signal is applied to a programmable down counter 106. Programming in a hardware implementation of the invention is done by simple setting of double in line package (DIP) switches. The output signal of the counter results in generation of the desired mark frequency ($f_m$) Counter 106 uses the mark frequency to generate a signal that is analogous to a 4-phase signal.

The 4-phase signal is used in digitally filtering the multiplexed subcarrier signals S+ and S− to determine the energy in an extremely narrow bandwidth centered on the mark frequency. A digital filter is implemented in hardware by a differential 4 to 1 multiplexor 112, low pass filters 114 and 116, buffering amplifiers 118 and 120, and a summing element 122. Those skilled in the art will now realize that parallel digital filtering of a number, of the multiplexed subcarrier signals can be implemented using a programmable digital signal processor. A digital signal processor is a type of dedicated microprocessor.

Differential 4 to 1 multiplexor 112 takes as inputs a 4-phase signal docked at the frequency of the mark frequency and the multiplexed subcarrier signals. The clock is synchronized in frequency with the mark frequency as a result of deriving the clock from the underlying frequency of the power signal. Because the phase of the actual mark frequency is unknown and may be subject to random or pseudorandom phase shifts, the 4-phase reference signal is used to sample the multiplexed subcarrier signals each quarter phase of the mark frequency. The subcarrier signal having the selected mark frequency is mixed with the reference signal and the resulting signal passes to the low pass filters 114 and 116. Low pass filters 114 and 116 remove signals of other frequencies from the essentially dc signals produced. The signals are buffered by amplifying buffers 118 and 120 and summed by summer 122 to produce an intensity measurement signal approximately proportional to the energy level in the band of interest centered on the mark frequency.

The generation of an intensity measurement signal for the space frequency of an associated pair is done in an identical manner. Single channel UNB generator 100 receives the 60 cycle square wave reference for reproducing a reference signal of the predetermined space frequency. The reference signal is applied to a programmable down counter 126. The output signal of counter 126 is a 4-phase signal having the desired space frequency ($f_s$).

The 4-phase signal is used in digitally filtering the multiplexed subcarrier signals S+ and S− to determine the energy in an extremely narrow bandwidth centered on the space frequency. A digital filter is implemented in hardware by a differential 4 to 1 multiplexor 132, low pass filters 134 and 136, buffering amplifiers 138 and 140, and a summing element 142.

Differential 4 to 1 multiplexor 132 takes as inputs a 4-phase signal clocked at the frequency of the space frequency and the multiplexed subcarrier signals. This clock should have the same frequency as the space frequency because the clock is derived from the underlying frequency of the power signal. Again the signal centered on the desired space frequency is of unknown and potentially shifting phase. The 4-phase reference signal is used by differential 4 to 1 mux 132 to sample the multiplexed subcarrier signals each quarter phase of the space frequency. A subcarrier signal centered on the desired space frequency is mixed with the reference signal and the resulting signal passes to the low pass filters 134 and 136. Low pass filters 134 and 136 remove signals of other frequencies from the essentially dc signals produced, the signals are buffered by amplifying buffers 138 and 140 and summed by summer 142 to produce a signal approximately proportional to the energy level in the band of interest centered on the space frequency.

Differential amplifier 102 compares the mark and space frequency energy intensity signals and generates a positive signal if the mark signal is more intense and a negative signal if the space frequency is more intense. Display 104 includes two light emitting diodes 144 and 146, oriented to conduct in opposite directions, connecting amplifier 102 to ground. LED 144, indicating on status of a lamp, is oriented to conduct from amplifier 102 to ground and emits a green light. LED 146 is oriented to conduct from ground to amplifier output, satisfying a negative current from the amplifier. LED 146 emits a red light to indicate lamp failure. Because the signal frequencies identify the source of lamp status information, the LED's are associated with particular lamps in a monitored group.

The invention of this patent affords the advantages of using extremely narrow bandwidth communications without requiring high stability components. Applications of the invention provide data transmission at bandwidths of 0.001 Hz at radio frequencies, an achievement this inventor believes was generally considered impractical. Applications of the invention to airfield runway lamp monitoring systems and meter reading, using existing power distribution systems as the transmission medium, were suggested above. The system can also be applied to monitoring geographically distributed installations, such as sewage or water lift stations, using low power, unlicensed radio wave transmission.

In all applications, the system provides: 1) a high degree of noise immunity, which allows the use of low power transmitters; 2) the ability to use several transmitters operating asynchronously on a single channel.

Although described above using a plurality of transmitters communicating to a single receiver, it is to be understood that a single transmitter and a single receiver are sufficient to comprise a communications system. In addition, systems involving multiple receivers and a single transmitter are also included. For instance, a plurality of receivers could be located in a selected residential area wherein each receiver controls power to a selected appliance in the home such as a water heater or air conditioner. The residential area is provided power from a single substation where a single transmitter is located. The transmitter can then be used to control the selected appliances by transmitting control signals to each of the receivers using the layered modulation of the present invention.

While a hardware implementation of the preferred embodiment has been taught, those skilled in the art will now realize that the invention can also be realized using appropriately programmed digital signal processors in either the transmitters, the receivers, or both.

Although the present invention has been described with reference to preferred embodiments, workers skilled in the art will recognize that changes may be made in form and detail without departing from the spirit and scope of the invention.

What is claimed is:

1. A power line distribution communications system for transmitting selected information on an electric power distribution line transmitting power at a selected power frequency, the power line distribution communications system comprising:
    a transmitter coupled to the electric power distribution line comprising:
        an information signal generator providing an information signal;
        first reference means for detecting a power frequency of an alternating current transmitted on the electric power distribution line;
        a first modulator connected to the information signal generator for taking the information signal as a modulating input for modulation of a subcarrier signal, the first modulator being operably connected to the first reference means such that the subcarrier signal has a frequency derived from and numerically referenced to the detected power frequency; and
        a second modulator taking the subcarrier signal as a modulating input for modulation of an output carrier signal, the output carrier signal having a frequency higher than the subcarrier signal; and
    a receiver coupled to the electric power distribution line comprising:
        second reference means for detecting the power frequency of the alternating current transmitted on the electric power distribution line and providing a reference signal indicative of the detected power frequency;
        means for demodulating the subcarrier signal from the output carrier signal; and
        means operably connected to the second reference means for demodulating the information signal from the subcarrier signal using the reference signal.

2. The power line distribution communications system of claim 1 wherein the first modulator is a frequency shift keying modulator and the subcarrier signal is modulated using frequency shift keying between an assigned mark frequency and an assigned space frequency.

3. The power line distribution communications system of claim 1 wherein the electric power distribution line provides power to a lamp at a selected location, and wherein the transmitter is located at the selected location, and wherein the information signal generator comprises a lamp sensor providing the information signal indicating operational status of the lamp.

4. The power line distribution communications system of claim 1 wherein the electric power distribution line provides power to a selected location, and wherein the transmitter is located at that selected location, and wherein the information signal generator comprises a power meter providing the information signal indicating power provided to the selected location.

5. The power line distribution communications system of claim 3 wherein the lamp is part of an airmen navigation aid.

6. The power line distribution communications system of claim 1 wherein the second modulator is a phase modulator.

7. The power line distribution communications system of claim 6 wherein the first modulator is a frequency shift keying modulator.

8. The power line distribution communications system of claim 7, and further including a plurality of transmitters coupled to the electric power distribution line, wherein each transmitter comprises:
    an information signal generator providing an information signal;
    first reference means for detecting a power frequency of an alternating current transmitted on the electric power distribution line;
    a frequency shift keying modulator connected to the information signal generator for taking the information signal as a modulating input for modulation of a subcarrier signal, the first reference means being operably connected to the first reference means such that the subcarrier signal has a frequency derived from and numerically referenced to the detected power frequency; and
    a second modulator taking the subcarrier signal as a modulating input for modulating of an output carrier signal, the output carrier signal having a frequency higher than the subcarrier signal; and
    wherein each transmitter is assigned an exclusive pair of mark and space frequencies for the subcarrier signal.

9. The power line distribution communications system of claim 1 wherein the first modulator is a phase modulator.

10. The power line distribution communications system of claim 1 wherein the first modulator is an amplitude modulator.

11. The power line distribution communications system of claim 1 wherein the second modulator an amplitude modulator.

12. The power line distribution communications system of claim 1 wherein the second modulator is operably connected to the first reference means and the output carrier signal has a frequency derived from and numerically referenced to the detected power frequency.

13. The power line distribution communications system of claim 12 wherein the frequency of the output carrier signal is equal to the power frequency.

14. The power line distribution communications system of claim 1 wherein the subcarrier signal has a bandwidth less than one hertz.

15. A method of communicating information from a plurality of transmitters to a remote receiver station along a common electric power distribution line transmitting power at a selected power frequency, wherein a transmitter is provided at each of a plurality of spaced-apart transmitting locations, the method comprising the steps of:
    obtaining the information to be transmitted;
    generating an information signal at each transmitter location using the information to be transmitted;
    detecting a power frequency of an alternating current transmitted on the electric power distribution line at each transmitting location and providing an output signal as a function of the frequency of the alternating current;

generating a subcarrier signal for each of the information signals using the output signal, the subcarrier signal having a frequency derived from and numerically referenced to the detected power frequency;

modulating each subcarrier signal as a function of its associated information signal;

modulating an output carrier signal with each subcarrier signal, the output carrier signal having a frequency higher than the subcarrier signal;

transmitting the output carrier signals over the electric power distribution line;

detecting the power frequency of the alternating current transmitted on the electric power distribution line at a receiving location and providing a reference signal indicative of the detected power frequency;

recovering all carrier signals from the power distribution line;

demodulating the subcarrier signals from the output carrier signals;

demodulating the information signals from the subcarrier signals using the reference signal to provide associated output signals; and interpreting each of the output signals to obtain the information from each transmitting location.

16. The method of claim 15 wherein all output carrier signals are centered on the same frequency.

17. The method of claim 15 wherein the step of modulating each subcarrier signal comprises modulating each subcarrier signal using frequency shift keying.

18. The method of claim 15 wherein the step of modulating an output carrier signal comprises modulating an output carrier signal using phase modulation.

19. A power line distribution communications system for transmitting selected information on an electric power distribution line transmitting power at a selected power frequency, the power line distribution communications system comprising:

a transmitter coupled to the electric power distribution line comprising:
an information signal generator providing an information signal;
first reference means for detecting a power frequency of an alternating current transmitted on the electric power distribution line;
a first modulator connected to the information signal generator for taking the information signal as a modulating input for modulation of a subcarrier signal; and
a second modulator connected to the first modulator for taking the subcarrier signal as a modulating input for modulation of an output carrier signal, the second modulator being operably connected to the first reference means such that the output carrier signal has a frequency derived from and numerically referenced to the detected power frequency and a frequency higher than the subcarrier signal; and a receiver coupled to the electric power distribution line comprising:
second reference means for detecting the power frequency of the alternating current on the electric power distribution line and providing a reference signal indicative of the detected power frequency;
means for demodulating the subcarrier signal from the output carrier signal; and
means operably connected to the second reference means for demodulating the information signal from the subcarrier signal using the reference signal.

20. The power line distribution communications system of claim 19 wherein the frequency of the output carrier signal is equal to the power frequency.

21. A power line distribution communications system for transmitting selected information on an electric power distribution line transmitting power at a selected power frequency, the power line distribution communications system comprising:

a transmitter coupled to the electric power distribution line comprising:
an information signal generator providing an information signal;
first reference means for detecting a power frequency of an alternating current transmitted on the electric power distribution line;
a first modulator connected to the information signal generator for taking the information signal as a modulating input for modulation of a subcarrier signal, the first modulator being operably connected to the first reference means such that the subcarrier signal having a bandwidth less than one hertz and a frequency derived from and numerically referenced to the detected power frequency; and
a second modulator taking the subcarrier signal as a modulating input for modulation of an output carrier signal, the second modulator being operably connected to the first reference means such that the output carrier signal has a frequency derived from and numerically referenced to the detected power frequency and higher than the subcarrier signal; and
a receiver coupled to the electric power distribution line comprising:
second reference means for detecting the power frequency of the alternating current transmitted on the electric power distribution line and providing a reference signal indicative of the detected power frequency;
means for demodulating the subcarrier signal from the output carrier signal; and
means operably connected to the second reference means for demodulating the information signals from the subcarrier signal using the reference signal.

* * * * *